United States Patent [19]

Linz

[11] Patent Number: 5,021,690

[45] Date of Patent: Jun. 4, 1991

[54] PROGRAMMABLE LOGIC ARRAY APPARATUS

[75] Inventor: Alfredo R. Linz, Austin, Tex.

[73] Assignee: Advanced Micro Devices, Inc., Sunnyvale, Calif.

[21] Appl. No.: 434,797

[22] Filed: Nov. 13, 1989

[51] Int. Cl.$^5$ ............................................ H03K 17/04
[52] U.S. Cl. ...................................... 307/465; 307/468; 307/469; 307/481; 364/716
[58] Field of Search ............... 307/465, 468, 469, 481; 364/716

[56] References Cited

U.S. PATENT DOCUMENTS

| | | | |
|---|---|---|---|
| 4,534,008 | 8/1985 | Fuchs et al. | 364/716 |
| 4,725,748 | 2/1988 | Kondo et al. | 307/465 |
| 4,769,562 | 9/1988 | Ghisio | 307/469 |
| 4,902,918 | 2/1990 | Sugeno et al. | 307/469 |

Primary Examiner—Stanley D. Miller
Assistant Examiner—Scott A. Ouellette
Attorney, Agent, or Firm—Foley & Lardner

[57] ABSTRACT

An apparatus adaptable for use as a programmable logic array as disclosed for receiving control signals from a signal source and producing resultant output signals logically related to the control signals according to a program which is comprised of a plurality of program instructions, each of which is identified by an address. The apparatus includes a clock for generating a plurality of clock signals and first and second iteration processing circuits for effecting iteration operations upon the input signals and producing resultant output signals on a plurality of output lines. The apparatus further includes a plurality of minterm lines common to the first and second iteration processing circuits. The first iteration processing circuit includes a plurality of first switching devices connected in series within selected of the minterm lines and gated by the input signals. The program is executed within the first iteration processing circuit by selectively gating appropriate of the switching devices to define a continuous path for discharging selected of the minterm lines. Placement of the first switching devices within the first iteration processing circuit is defined by the program. Selection of the minterm lines for participation in a respective program instruction is determined according to the address of the particular program instruction, which address is stored in a cyclic memory device. The apparatus is arranged in a plurality of blocks, each of which blocks implements a predetermined group of program instructions in a pipeline manner.

23 Claims, 6 Drawing Sheets

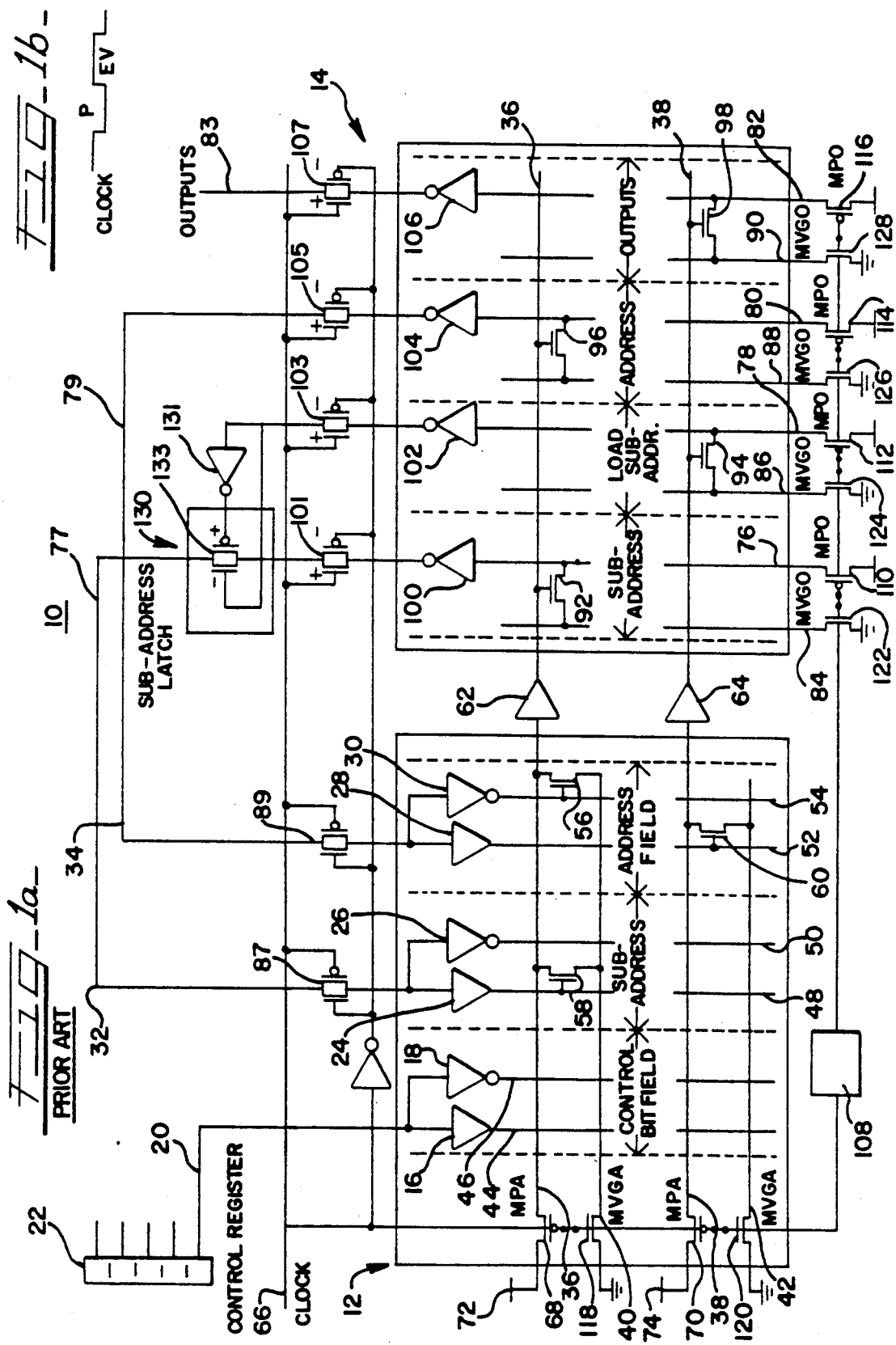

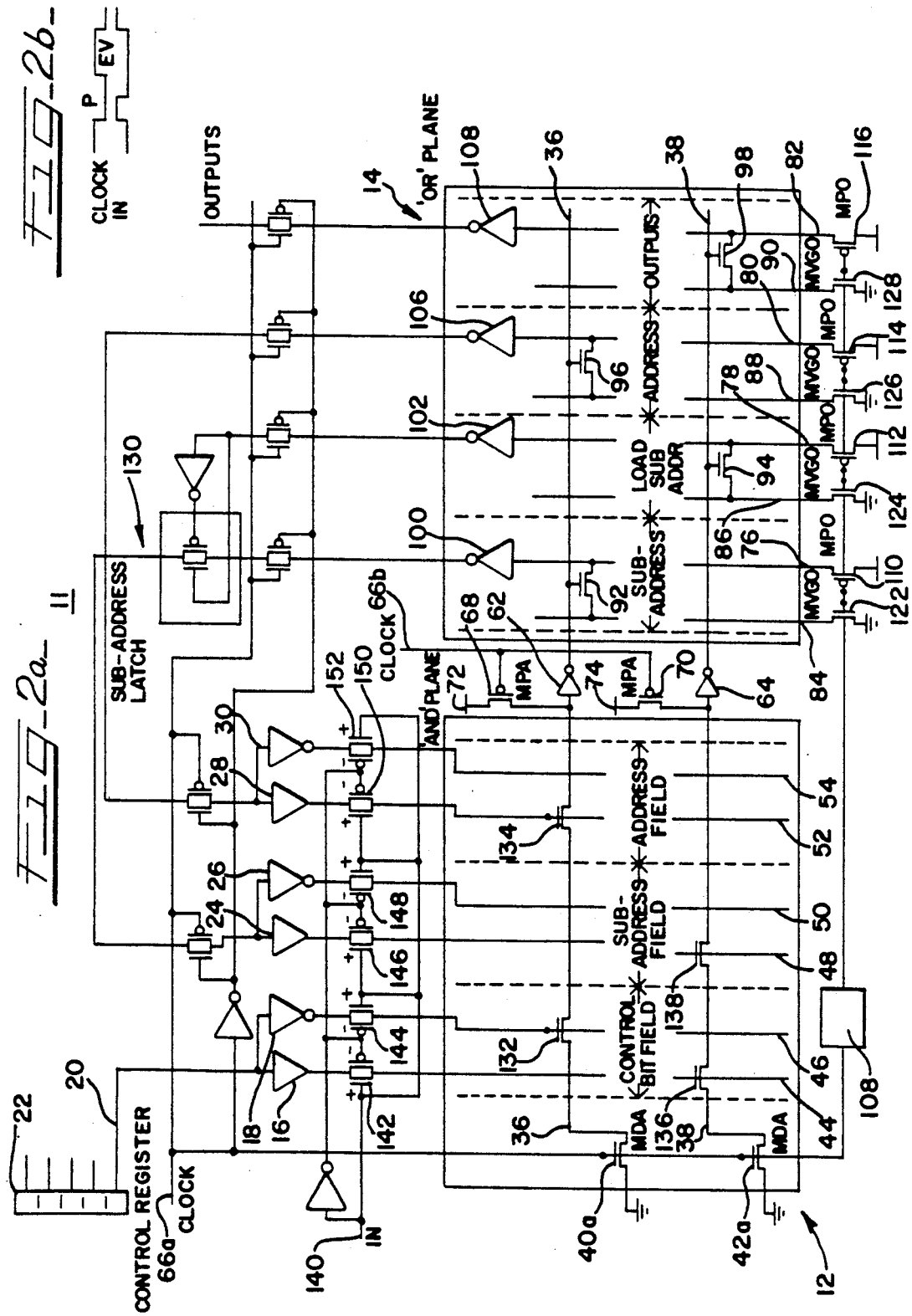

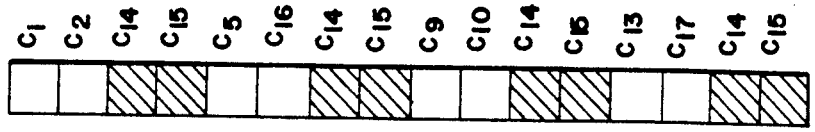
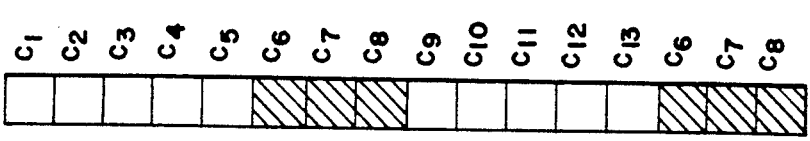
Fig-3b-
Fig-3a-

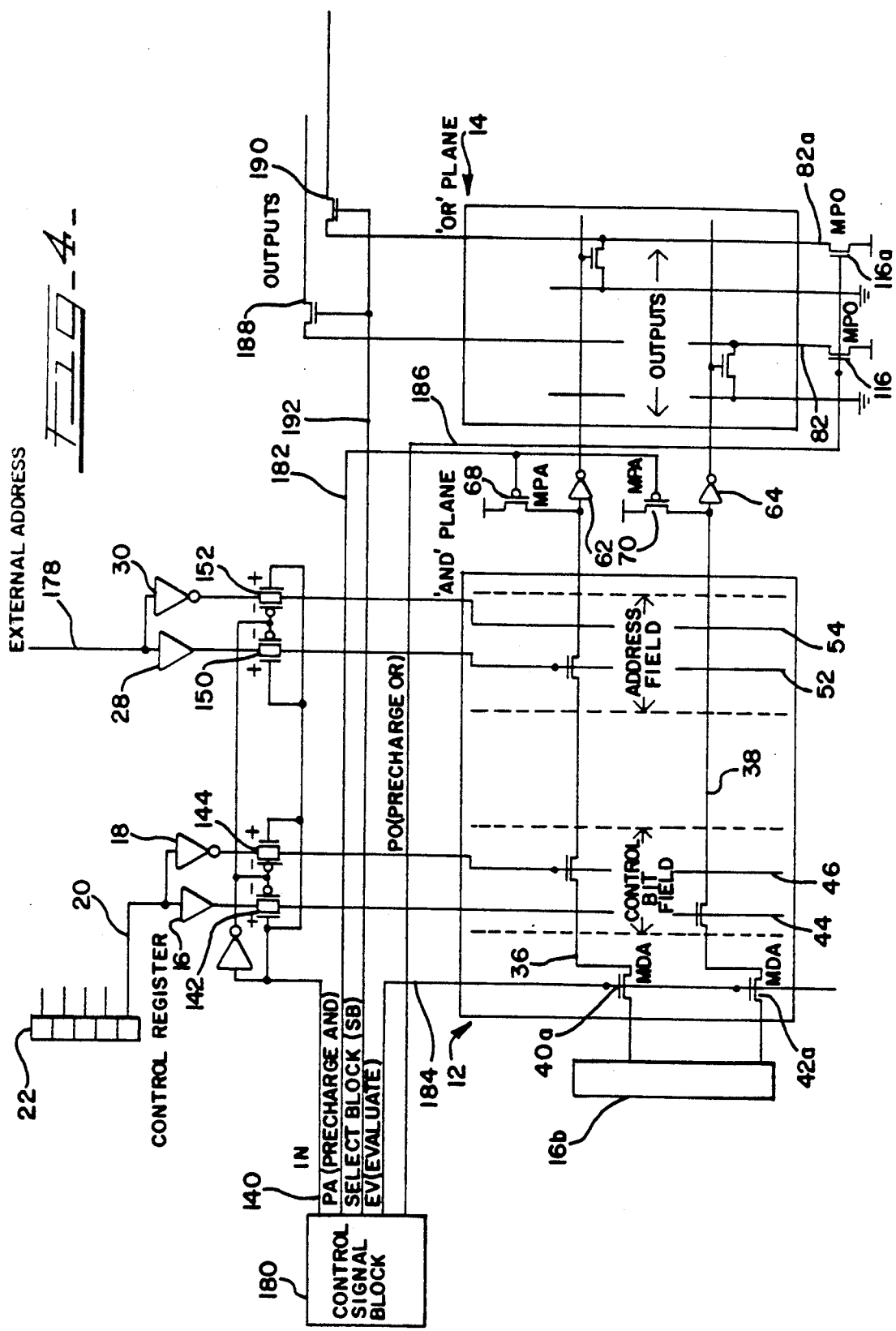

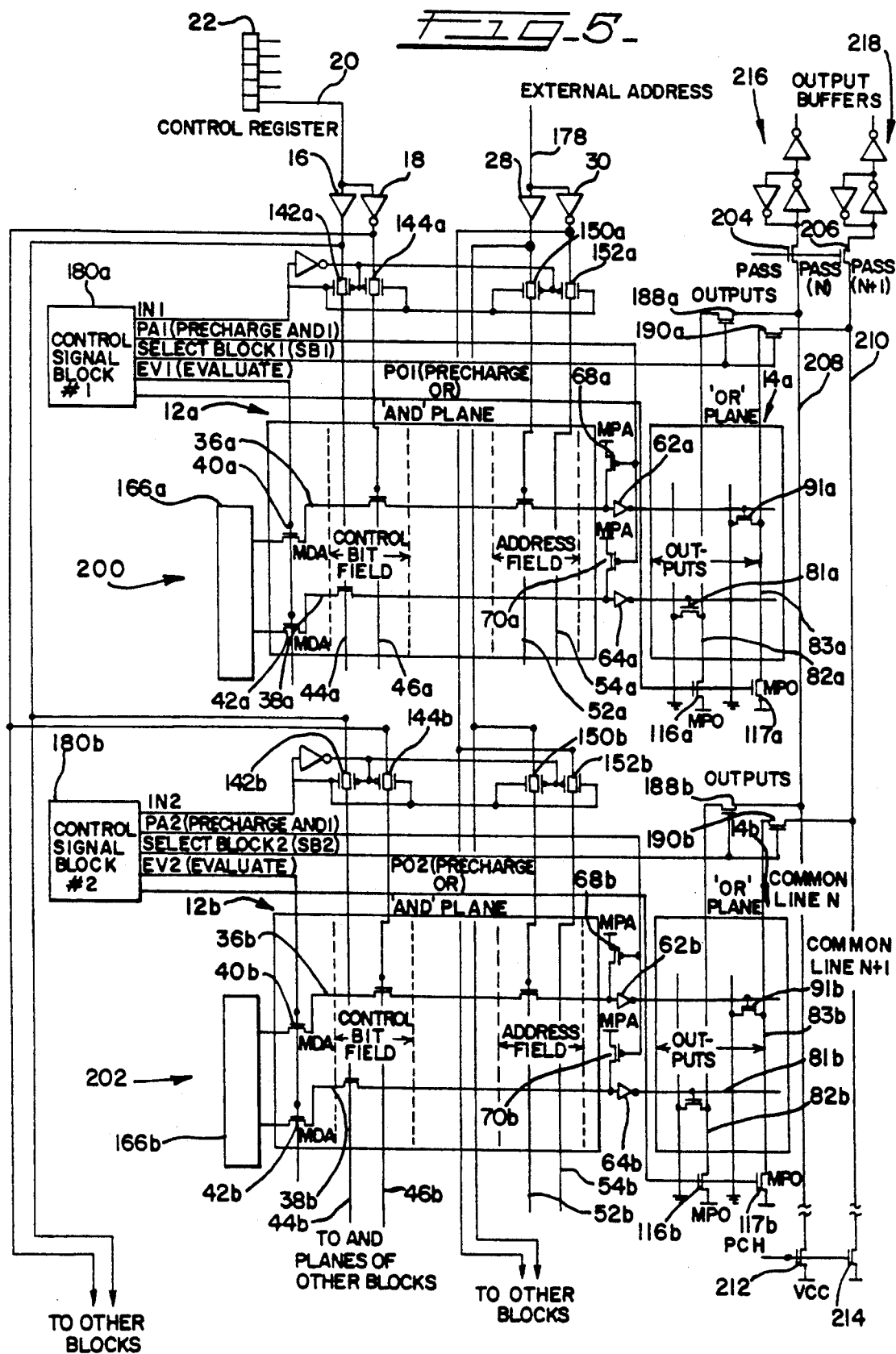
FIG_5

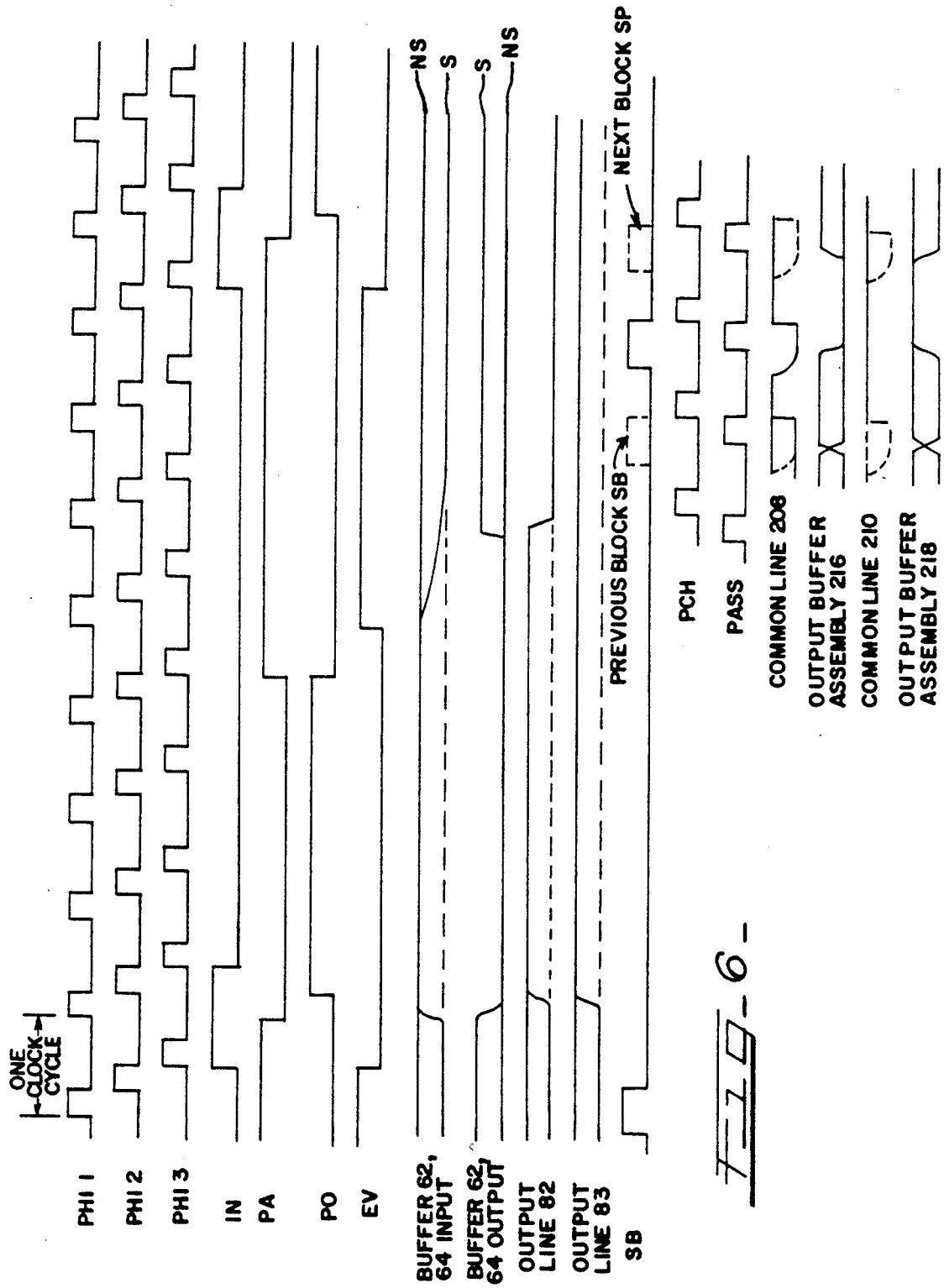

PROGRAMMABLE LOGIC ARRAY APPARATUS

BACKGROUND OF THE INVENTION

The present invention is directed to a programmable logic array apparatus, and, in particular, a programmable logic array apparatus which combines techniques of pipelining and simplified addressing with the use of a NAND-type AND plane to achieve reduced power dissipation to the order of about one-tenth the power dissipation of prior art devices while occupying substantially similar area when embodied in an integrated circuit structure.

In modern integrated circuits used in telecommunication applications, voice signals are processed digitally by a micro engine. Such a micro engine is a dedicated signal processor which may employ, for example, an arithmetic logic unit with separate program memory, a data memory, and a coefficient memory. While the data and coefficient memories in such a configuration are generally read-write memories, the program memory is normally implemented as a programmable logic array, or a read-only memory.

The time taken by the micro engine to process one sample is called a "frame", and is, for example, equal to 125 $\mu$seconds in pulse code modulation systems operating at an 8 KHz sampling rate. The micro engine is required to perform a certain number of instructions in a given frame, which number of instructions may, for example, range between 256 and 1024. Thus, fast access time is required from instruction storage, often as short as 125 nanosec. Such fast access time dictates a fast programmable logic array or read-only memory structure with attendant high power dissipation, a disadvantage which is desirable to overcome.

Other design criteria of importance in configuring integrated circuits include circuit complexity and area occupied by the integrated circuit. It is desirable to reduce circuit complexity in order that manufacturing may be conducted on a production scale with reliability and repeatability within tight limits. The area occupied by the circuit (the "real estate") is another factor which it is desirable to keep low for economic reasons.

The present invention is designed to provide a low power programmable logic array structure which is economically manufacturable on a production scale and which does not occupy excessive area in an integrated circuit structure.

SUMMARY OF THE INVENTION

The invention is a programmable logic array apparatus for receiving multi-bit input signals from a signal source and producing resultant output signals logically related to the input signals according to a program.

The invention, in its preferred embodiment, includes a clock for generating a plurality of clock signals and first iteration processing circuitry for effecting a first iteration operation upon the input signals and producing first iteration output signals which are received by a second iteration processing circuit. The second iteration processing circuit effects a second iteration operation upon the first iteration output signals and produces the resultant output signals.

Further included in the preferred embodiment of the present invention are a plurality of electrically conductive common lines which are common to the first iteration processing circuit and the second iteration processing circuit.

The first iteration processing circuit includes a plurality of first signal lines cooperating with the common lines to define an array of first crosspoints, and the second iteration processing circuit includes a plurality of second signal lines cooperating with the plurality of common lines to define an array of second crosspoints. The input signals are received by the plurality of first signal lines and the resultant output signals are presented by the second signal lines, at least one of the second signal lines may be operatively connected to the first iteration processing circuit for conveying address information. The address information may also be generated by circuitry not included in the second iteration processing circuit.

The first iteration processing circuit and the second iteration processing circuit each have first switches responsive to the clock signals for selectively connecting a voltage source to effect precharging of the second signal lines and the common lines. The common lines are operatively selectively connected to second switches responsive to the clock signal for connecting the common lines to ground.

The first iteration processing circuit further includes an array of third switches for affecting continuity of at least a portion of selected of the common lines. The third switches are serially connected in certain of the common lines, and are gated by selected of the first signal lines according to the program so that gating of appropriate of the third switches connects predetermined portions of the common lines to ground.

In the preferred embodiment, the program is made up of a plurality of program steps, each having an associated multi-bit address, and the addresses have an established fixed order of occurrence for execution of the program steps. At least a portion of the address bits are stored in a cyclic register which is operatively connected to the common lines and effects selective enablement of those common lines as certain bits are cycled through the register. In the preferred embodiment of the present invention, precharging, application of input signals to the first iteration processing circuit, and gating of the various switches within the invention are controlled by separate clock signals.

The first and second iteration processing circuits are preferably arranged in a plurality of blocks, each of which has at least one output line applied to a common output line which terminates in an output buffer for holding the resultant output signals.

It is therefore an object of the present invention to provide a programmable logic array apparatus which dissipates significantly less power during its operation than presently existing prior art programmable logic array apparatuses.

A further object of the present invention is to provide a programmable logic array apparatus which is reliably economically manufacturable in production quantities.

Yet a further object of the present invention is to provide a programmable logic array apparatus which occupies substantially similar area in an integrated circuit structure as presently existing prior art devices.

Further objects and features of the present invention will be apparent in the following specification and claims when considered in connection with the accompanying drawings illustrating the preferred embodiment of the invention.

DETAILED DESCRIPTION OF THE DRAWINGS

FIG. 1a is an electrical schematic diagram of a programmable logic array representative of prior art devices.

FIG. 1b is a timing diagram illustrating the precharge and evaluation clock signals utilized in operating the prior art programmable logic array illustrated in FIG. 1a.

FIG. 2a is an electrical schematic diagram of an interim embodiment of the present invention illustrating some of the improvements incorporated in the preferred embodiment of the present invention.

FIG. 2b is a clocking diagram illustrating the clock signals utilized in operating the interim embodiment of the programmable logic array apparatus of the present invention which is illustrated in FIG. 2a.

FIG. 3a is an electrical schematic diagram illustrating the employment of a cyclic register storing address information to effect selective enablement of common lines within a first iteration processing circuit of the preferred embodiment of the present invention.

FIG. 3b is a table representing a short program, the sequencing of which is performed by the structure in FIG. 3a.

FIG. 4 is an electrical schematic diagram of a second interim embodiment of the present invention illustrating additional features incorporated in the preferred embodiment of the present invention.

FIG. 5 is a partial electrical schematic diagram of the preferred embodiment of the present invention.

FIG. 6 is a timing diagram illustrating clocking signals employed in the operation of one block of the programmable logic array apparatus illustrated in FIG. 5.

DETAILED DESCRIPTION OF THE INVENTION

An electrical schematic diagram of a prior art programmable logic array apparatus 10 is illustrated in FIG. 1a. The programmable logic array 10 is comprised of two portions: an "AND" plane 12 and an "OR" plane 14. The AND plane 12 is comprised of a plurality of control bit buffers represented by buffer 16 and inverting buffer 18. Of course, the control bit buffer 16 and inverting control bit buffer 18 are representative of similar tandem arrangements of control bit buffers and control bit inverting buffers associated with each control bit input line 20 by which control bits are provided to the AND plane 12 from control register 22.

AND plane 12 further includes sub-address bit buffer 24 and sub-address bit inverting buffer 26 as well as address bit buffer 28 and address bit inverting buffer 30.

Of course, similar to the representation of control bit buffer tandem arrangements, the sub-address bit buffers 24 and 26 and the address bit buffers 28 and 30 are representative of tandem buffer arrangements associated with each of a multiplicity of sub-address bit input lines 32 and address bit input lines 34, respectively.

Thus, the AND plane 12 of FIG. 1a has two types of inputs: control bits provided by control bit input line(s) 20, which select different special functions or enable and disable filters and form the control bit field; and address information that selects the execution of a particular instruction, which appears in the form of sub-address bits provided by sub-address bit line(s) 32 and address bits provided by address bit input line(s) 34.

The AND plane 12 further comprises a plurality of minterm common lines, represented in FIG. 1a by common lines 36 and 38. Associated with each of the common lines 36 and 38 are companion virtual ground lines, represented in FIG. 1a by companion virtual ground lines 40 and 42. Control bit lines 44 and 46 are connected, respectively, to the outputs of control bit buffer 16 and control bit inverting buffer 18; sub-address bit lines 48 and 50 are connected, respectively, to sub-address bit buffer 24 and sub-address bit inverting buffer 26; and address bit lines 52 and 54 are connected, respectively, to the outputs of address bit buffer 28 and address bit inverting buffer 30.

The common lines 36 and 38 are selectively connected to virtual ground lines 40 and 42 by switching transistors according to the program to be implemented by the programmable logic array apparatus 10. The switching transistor connections are represented in FIG. 1a by switching transistors 56, 58, and 60. The switching transistors 56, 58, and 60 are gated, as illustrated in FIG. 1a, by appropriate control bit lines, sub-address bit lines, and address bit lines, according to the program to be implemented by the programmable logic array apparatus 10.

Thus, by way of illustration, in FIG. 1a the switching transistor 58 connects common line 36 with virtual ground line 40 and is gated by sub-address line 48; the switching transistor 56 also connects common line 36 with virtual ground line 40 and is gated by address bit line 54; and switching transistor 60 connects common line 38 with virtual ground line 42 and is gated by address bit line 52. No switching transistors are illustrated in FIG. 1a which are switched by a control bit line 44 or 46, however, that is only because FIG. 1a is a very reduced representation of a prior art programmable logic array apparatus. An actual programmable logic array apparatus could have hundreds of common lines, as well as multiple control bit lines, sub-address bit lines, and address bit lines. Thus, the program may require connection of a common line to its associated virtual ground line via a switching transistor which is gated by a control bit line 44 or 46.

Associated with each common line 36, 38 are buffers 62, 64 intermediate the AND plane 12 and the OR plane 14. During operation, the clocking function is applied to the apparatus 10 according to the clocking signal represented in FIG. 1b at the clock input connection 66. The precharge clocking signal, represented by "P" in FIG. 1b, enables the MPA switching transistor 68 to connect reference voltage VCC from reference voltage source 72 to common line 36, and enables MPA switching transistor 70 to connect reference voltage VCC from reference voltage source 74 to common line 38, thereby precharging common lines 36 and 38 with reference voltage VCC up to buffers 62 and 64. At the same time, MVGA transistors 118 and 120 are turned off, eliminating any discharge paths through the MPA switching transistors 68, 70.

The outputs of buffers 62 and 64 are connected to continuations of minterm lines 36 and 38 which extend into the OR plane 14. Transverse of the common lines 36 and 38 within the OR plane 14 are a plurality of output lines associated with sub-address, load sub-address, address, and output bits. These output lines are represented in FIG. 1a by sub-address output line 76, load sub-address output line 78, address output line 80, and resultant output line 82. Companion virtual ground lines are associated with each of the output lines in the OR plane 14 so that sub-address output line 76 has a companion virtual ground line 84, load sub-address output line 78 has a companion virtual ground line 86, address output line 80 has a companion virtual ground line 88, and resultant output line 82 has a companion virtual ground line 90.

A selection of the output lines 76, 78, 80, and 82, are connected to their respective companion virtual ground lines 84, 86, 88, and 90 by switching transistors which are driven by common lines 36 and 38. Selection of the various connections between output lines and companion virtual ground lines and selection of which of the common lines 36 and 38 drive the switching transistors effecting such connection, are determined by the program to be implemented by the apparatus 10. Such switch placement is represented in FIG. 1a by switching transistors 92, 94, 96, and 98.

Thus, switching transistor 92 connects sub-address output line 76 with its companion virtual ground line 84 and is driven by common line 36; switching transistor 94 connects load sub-address output line 78 with its companion virtual ground line 86 and is driven by common line 38; switching transistor 96 connects address output line 80 with its companion virtual ground line 88 and is driven by common line 36; and switching transistor 98 connects resultant output line 82 with its companion virtual ground line 90 and is driven by common line 38.

The output lines of OR plane 14 are terminated in inverting output buffers, so that, as represented in FIG. 1a, sub-address output line 76 terminates in inverting output buffer 100; load sub-address output line 78 terminates in inverting output buffer 102; address output line 80 terminates in inverting output buffer 104; and resultant output line 82 terminates in inverting output buffer 106.

Precharging of the OR plane 14 is effected through a delayed clock 108 in order to insure that MPO transistors 110, 112, 114, and 116 are gated after all minterm lines 36 and 38 have stabilized in a precharged state. As a consequence of such delayed gating, the associated output lines 76, 78, 80, and 82, as well as associated virtual ground lines 84, 86, 88, and 90, are precharged only after all minterm lines 36 and 38 have stabilized.

An evaluation signal (represented by pulse "EV" in FIG. 1b) follows precharge signal "P" and is delayed for OR plane 14 by delayed clock 108. Evaluation signal EV opens MPA transistors 68 and 70. After a delay imposed by delay clock 108, evaluation signal EV opens MPO precharging transistors 110, 112, 114, and 116. The high signal associated with evaluation signal EV also closes MVGA switching transistors 118 and 120, thereby connecting virtual ground lines 40 and 42 to ground. After a delay imposed by delay clock 108, evaluation signal EV similarly closes MVGO switching transistors 122, 124, 126, and 128, thereby connecting virtual ground lines 84, 86, 88, and 90 to ground.

In such manner, the output lines 76, 78, 80, and 90 are selectively grounded, depending upon whether a given minterm line 36 or 38 has been grounded by the gating of a switching transistor 56, 58, 60, and further depending upon whether a given output line has been gated by a minterm line 36, 38 to ground by enabling a switching transistor 92, 94, 96, 98 in OR plane 14. For example, if sub-address bit line 48 gates switching transistor 58, then during the evaluation signal EV, the minterm line 36 will be connected to ground through switching transistor 58, virtual ground line 40, and MVGA switching transistor 118. Such grounding of common line 36 precludes gating of switching transistor 92 or 96 so that enabling MVGO switching transistor 122 or 126 would have no grounding effect upon output lines 76 and 80. Therefore, output lines 76 and 80 would have a +1 signal at the input of buffers 100 and 104, respectively. Only one minterm line remains charged every time an evaluation signal EV pulse occurs.

Sub-address output line 76 is connected through inverting output buffer 100 to output transmission gate 101, load sub-address output line 78 is connected through inverting output buffer 102 to output transmission gate 103, address output line 80 is connected through inverting output buffer 104 to output transmission gate 105, and resultant output line 82 is connected through inverting output buffer 106 to output transmission gate 107. Each output transmission gate 101, 103, 105, 107 is comprised of an n-channel field effect transistor in parallel with a p-channel field effect transistor so that each transmission gate will be in a conducting state when the n-channel input is positive and the p-channel input is negative. The output transmission gates 101, 103, 105, 107 are responsive to the clock signal applied at input 66 in a manner whereby when the evaluation signal EV is positive, as indicated in FIG. 1b, the polarities of the respective output transmission gates 101, 103, 105, 107 are as indicated in FIG. 1a, and in such condition with each output transmission gate 101, 103, 105, 107, having its n-input positive and its p-input negative, is enabled and allows the signal applied thereto to pass. Thus, when the evaluation signal EV is positive, the signals present on sub-address output line 76, load sub-address output line 78, and address output line 80 are passed through and inverted by inverting buffers 100, 102, and 104 and applied to the AND plane 12. Specifically, the sub-address output inverted signal is applied via line 77 to an input transmission gate 87, the load sub-address signal 78 is inverted and applied to the sub-address latch 130 to control transmission of the sub-address signal via line 77 to input transmission gate 87, and the address bit signal (inverted) is passed via line 79 to input transmission gate 89. The resultant output bit signal 82 is inverted and passed to output line 83.

The input transmission gates 87, 89 are connected with opposite polarity with respect to the clock signal than the output transmission gates 101, 103, 105, 107 are connected. Accordingly, the input transmission gates 87, 89 are enabled and therefore transmit signals applied to them when the precharge signal P is applied at input 66. Thus, during the negative excursion of the precharge signal P, sub-address and address information is fed back from the OR plane 14 to the AND plane 12.

The transmission of sub-address information is controlled by the sub-address latch 130. When the load sub-address bit signal on line 78 is positive, it is inverted by inverting output buffer 102 and, during the evaluate EV signal pulse, is transmitted through output transmission gate 103 and applied to sub-address latch inverting buffer 131. Sub-address latch inverting buffer 131 consequently applies a positive signal to the p-input of sub-address latch transmission gate 133. A negative signal is simultaneously applied to the n-input of sub-address latch transmission gate 133, thereby rendering sub-address latch transmission gate 133 conductive and allowing the inverted sub-address bit signal to be passed to input transmission gate 87 via line 77.

Thus, as will be recognized by one skilled in the art, the OR plane 14 produces two kinds of outputs: an instruction itself, represented by resultant output line 82, and the address of the next instruction which is fed back to the AND plane 12 for the next cycle, the address is made up of lines represented by the sub-address output line 76, the load sub-address output line 78, and the address output line 80.

A typical program, or microcode, contains sub-routines or blocks of instructions that are executed repeatedly during a frame. These repeated blocks are coded only once. The repetition is achieved by making some of the address bits "don't care" (x) states. For example, a block that executes eight times per frame has the three most significant bits of the address set to "x". Once a routine is entered, however, a means of generating a different return address every time is required. To do this, the last instruction in the sub-routine is fully decoded, resulting in eight minterm lines in the programmable logic array apparatus being employed. Those eight minterm lines contain the return address and a control bit that loads that return address into a latch, such as sub-address latch 130 in FIG. 1a. In general, the address to be latched must contain all bits. However, the routine always must return to addresses which are themselves equidistant and that differ only in their three most significant bits. Thus, all eight return addresses will have all bits except the three most significant bits equal, and it is necessary only to latch those three most significant bits which form the sub-address. In such manner, the address field is sub-divided further into a sub-address and an address field, as illustrated in FIG. 1a.

The programmable logic array apparatus 10 illustrated in FIG. 1a is fast and requires a single clock; however, it wastes power. For example, all minterm lines 36, 38 are charged, and then all but one are discharged during operation of the apparatus 10. In a typical employment of the type of circuit illustrated in FIG. 1a, the number of minterm lines (M) is around 350, so that (M−1)/M (i.e., more than 99%) of the charge spent in the precharge cycle in the AND plane 12 is wasted.

Further, in a typical application, all of the minterm buffers 62, 64 except one undergo an unnecessary change of state. Thus, 99.7% of the short circuit current dissipated during switching is wasted as well.

Still further, the virtual ground lines in the AND plane 12, represented by virtual ground lines 40 and 42 in FIG. 1a, typically have a very large capacitance, on the order of 100 picofarads. Such virtual ground line capacitance must be recharged to the reference voltage (VCC) every cycle, which can be significant.

In the OR plane 14, the situation is somewhat less severe since only those output lines which must change state are discharged, while the remaining output lines remain charged. However, there is still some waste which occurs for output lines that must remain discharged from one instruction to the next succeeding instruction. Such lines are precharged, then discharged again; the buffers connected to those lines also change state as the lines are precharged, then most of them return to their previous state and, therefore, undergo a false transition. Such false transitions involve a still further waste of power.

The present invention provides a programmable logic array apparatus having a significantly reduced power dissipation (approximately one-tenth of the prior art device illustrated in FIG. 1a), with no impact on the access time, and with a silicon area substantially equal to that area required by the prior art device. The programmable logic array apparatus of the present invention achieves its advantages by combining several design improvements: a NAND-NOT-NOR structure instead of the NOR-NOR configuration of the prior art, elimination of the virtual ground lines employed in the prior art design, partitioning and pipelining, a new addressing scheme which eliminates the need for address bits in either plane while still handling branching and sub-routines, and the use of an output circuit that shields the output buffers from false transitions so that no power is dissipated when the outputs are in the majority logic state.

FIG. 2a is an electrical schematic diagram of an interim embodiment of the present invention illustrating employment of a NAND-NOT-NOR structure and elimination of the virtual ground lines. FIG. 2b illustrates the clocking signals employed in operating the programmable logic array apparatus illustrated in FIG. 2a.

For purposes of clarity in understanding the disclosure, like elements will be identified using like reference numerals throughout the various drawings.

In FIG. 2a, a programmable logic array apparatus 11 is comprised of two portions: an AND plane 12 and an OR plane 14. A significant difference between the embodiment of the present invention illustrated in FIG. 2a and the prior art programmable logic array apparatus illustrated in FIG. 1a is that in FIG. 2a, the AND plane 12 provides that each minterm line, represented by minterm lines 36 and 38, is arranged as a series combination of switching transistors. Thus, in FIG. 2a, minterm line 36 contains switching transistors 132 and 134 in series, and minterm line 38 contains switching transistors 136 and 138 in series. Preferably, switching transistors 132, 134, 136, 138 are n-channel field effect transistors. Also of importance, the operation of the apparatus of FIG. 2a is effected using a separate "IN" clocking signal, illustrated in FIG. 2b, which is applied to input pin 140.

Associated with the control bit buffer 16 is a control transmission gate 142, associated with the control bit inverting buffer 18 is a control transmission gate 144, associated with the sub-address bit buffer 24 is a control transmission gate 146, associated with the sub-address inverting buffer 26 is a control transmission gate 148, associated with the address bit buffer 28 is a control transmission gate 150, and associated with the address bit inverting buffer 30 is a control transmission gate 152. Each control transmission gate 142, 144, 146, 148, 150, 152 is comprised of an n-channel field effect transistor in parallel with a p-channel field effect transistor so that each control transmission gate will be in a conducting state when the n-channel input is positive and the p-channel input is negative.

Thus, when the IN clocking signal is applied to input pin 140, thereby applying a positive pulse as indicated in FIG. 2a, the control transmission gates 142, 144, 146, 148, 150, 152 are in a conductive state and control bits from control register 22 may pass via line(s) 20 to control bit lines 44 and 46, sub-address signals fed back from the OR plane 14 may be applied through sub-address bit buffer 24 and sub-address bit inverting buffer 26 to sub-address bit lines 48 and 50, and address signals fed back from OR plane 14 may be applied through address bit buffer 28 and address bit inverting buffer 30 to address bit lines 52 and 54. When the IN clock signal returns to 0, as indicated in FIG. 2b, the control transmission gates 142, 144, 146, 148, 150, 152 are non-conductive and no new control bit, sub-address bit, or address bit signals may be applied to the AND plane 12.

In the configuration illustrated in FIG. 2a, it is the bit lines (control bit lines 44 and 46, sub-address bit lines 48 and 50, and address bit lines 52 and 54) which gate the switching transistors 132, 134, 136, and 138 which are serially connected within the minterm lines 36 and 38. Thus, employment of the IN signal in the configuration of FIG. 2a provides that bit information carried on the bit lines 44, 46, 48, 50, 52 and 54 may change only while the IN signal is applied to the control transmission gates 142, 144, 146, 148, 150, and 152.

Referring to FIG. 2b, it may be noted that the commencement of the precharge signal P occurs at substantially the same time as the commencement of the IN signal, but the IN signal terminates before the precharge signal P terminates. This arrangement insures that the precharging of the AND plane 12 continues after the period during which the states of bit lines 44, 46, 48, 50, 52, and 54 may change. This arrangement precludes partial discharge of portions of unselected minterm lines which may be caused by electromagnetic coupling of minterm lines with bit lines, or other spurious discharges which may occur at the high frequencies anticipated for operation of the apparatus. As a result of this construction and clocking scheme, the virtual ground lines are no longer needed in the AND plane 12 and any delay in discharging the minterm lines 36, 38 will not result in spurious discharge of any output lines 76, 78, 80, 82 in the OR plane 14.

A limitation of this structure is that it can normally be used only when the number of bits in the AND plane 12 is small. A large number of devices, for example ten address lines plus three or four control bit lines, in series presents two problems: negative transitions in the bit lines can couple to a minterm line and may discharge it, and the discharge (evaluation) time increases beyond a time which is acceptable at the high frequencies of operation desired for the apparatus 11.

Negative transitions in the bit lines and coupling to minterm lines may be solved by controlling the time at which the inputs can change, such as using the IN signal to limit the times for change of bit lines. The unacceptable increase in evaluation time may be solved by a larger device size and, consequently, a greater real estate occupancy by the device in an integrated circuit structure. However, the increase in real estate is an unacceptable solution, so the structure must either have a reduced number of inputs to the AND plane 12 or there must be a relaxation of the requirement for fast access. The number of inputs to the AND plane 12 may be reduced by a new addressing scheme which will be described in greater detail hereinafter. The relaxation of the requirement for fast access may be addressed through taking advantage of the fixed order of instruction flow by pipelining, also to be described in greater detail hereinafter.

A further point worthy of note with regard to the AND plane 12 of the embodiment illustrated in FIG. 2a is that the minterm lines 36 and 38 are clocked for precharging through MPA switching transistors 68 and 70, as before in FIG. 1a, however the connection to the minterm lines 36 and 38 occurs adjacent the buffers 62 and 64. Preferably, MPA switching transistors 68, 70 are p-channel field effect transistors. Thus, for example, minterm line 36 will only discharge during evaluation through MDA switching transistor 40a when all switching transistors in minterm line 36 are gated. Preferably, MDA switching transistors 40a and 42a are n-channel field effect transistors. Only when all of switching transistor 132, switching transistor 134, and MDA transistor 40a are gated will the entire minterm line 36, up to buffer 62, be discharged to ground. If for example, switching transistor 134 is gated, but switching transistor 132 is not gated, there is continuity in minterm line 36 only from the buffer 62 to switching transistor 132. Only that portion between buffer 62 and switching transistor 132 must be precharged and not the entire minterm line 36, as would be the case with the apparatus 10 of FIG. 1a. The segment of minter line 36 between switching transistor 134 and buffer 62 may fall below the potential required for a fully charged signal as a result of the partial discharge of minterm line 36 by gating of switching transistor 132 after precharge. This is avoided by the use of the IN signal. In short, only those portions of minterm lines 36, 38 which are discharged (or partially discharged) must be precharged in subsequent cycles. As a result, significantly less power is required to operate the apparatus 11 of FIG. 2a as compared to prior art apparatuses 10 of FIG. 1a.

The OR plane 14 of the embodiment of the programmable logic array apparatus 11 illustrated in FIG. 2a is substantially the same as the OR plane 14 illustrated in connection with FIG. 1a. Therefore, in the interest of brevity, no discussion of the OR plane 14 of FIG. 2a will be repeated here.

FIG. 3a illustrates the employment of a cyclic register for storing address information to effect selective enablement of minterm common lines within the AND plane 12 of a programmable logic array apparatus. In such an arrangement a new addressing scheme is employed to eliminate the need for address bits in either the AND plane 12 or the OR plane (not shown in FIG. 3a) while still handling branching and sub-routine requirements of the program to be implemented by the programmable logic array apparatus, as shown in FIG. 3b.

FIG. 3a also illustrates the employment of partitioning and pipelining techniques to relax the requirement for fast access to the programmable logic array apparatus.

In FIG. 3a, an AND plane 12, appropriate for use in a programmable logic array apparatus, is illustrated. The AND plane 12 is segmented into blocks 154, 156, 158, and 160. In the type of application anticipated for employment of the programmable logic array of the present invention, the order of execution of instructions is fixed. In such situations, the programmable logic array apparatus can be partitioned into K blocks, each of which blocks operates at a rate $f/K = 1/(KT)$ where f is the frequency of operation in a non-partitioned apparatus and T is the period during which the precharge and evaluate signals are completed in a non-partitioned apparatus. In the illustrative example of FIG. 3a, K=4. A common arrangement for the instructions of the program within blocks is to provide for the first block to contain instructions 0, K, 2K, . . . ; the second block to contain the instructions 1, K+1, 2K+1, . . . ; and so on, with the final block containing instructions K−1, 2K−1, . . . .

Such an arrangement is illustrated in FIG. 3a where block 154 contains minterm lines $C_1$, $C_5$, $C_9$, and $C_{13}$; block 156 contains minterm lines $C_2$, $C_6$, $C_{10}$, $C_{16}$, and $C_{17}$; block 158 contains minterm lines $C_3$, $C_7$, $C_{11}$, and $C_{14}$; and 160 contains minterm lines $C_4$, $C_8$, $C_{12}$, and $C_{15}$.

The precharge and evaluate cycles for respective blocks are clocked to begin in succeeding order, a technique commonly described as pipelining. In such a succeeding order clocking arrangement, each block has a time K·T to precharge and evaluate; without this pipelining arrangement, each block would have only the period T in which to effect precharging and evaluation.

In the preferred embodiment of the present invention, this effect is accomplished by insuring that a time T after block 1 starts its cycle, block 2 starts its cycle. Block 3 is arranged to begin its cycle at a time T after block 2 begins, and so on. As a result, a time T after instruction 0 is evaluated from block 1, instruction 1 would be evaluated from block 2, and a time T after the evaluation of block 2, instruction 2 would be evaluated from block 3, and so on. In such manner, the rate at which the instructions are obtained by circuitry external of the AND plane 12 is at the rate f.

It is this partitioning of the AND plane 12 into blocks 154, 156, 158, 160 and the attendant pipelining (staggered timing) of precharge and evaluate signals among the various blocks which effects a relaxation of the requirement for fast access for operation of the programmable logic array apparatus.

An additional benefit of such partitioning is a further reduction in power dissipation. The component of power occasioned by charging and discharging the programmable logic array capacitance C to or from a voltage V at a rate of f is: $P = C \cdot f \cdot (V^2)$. The foregoing expression applies to an unpartitioned programmable logic array. For each block of a partitioned programmable logic array apparatus, the capacitance is reduced to C/K, and the rate is also reduced to f/K. Each block, therefore, dissipates $P_{block} = (C/K) \cdot (f/K) \cdot (V^2)$, which in turn equals $P/(K^2)$. For a total of K blocks, therefore, the total power dissipated is $K \cdot P_{block} = P/K$. Thus, a net reduction of power dissipation by a factor of 1/K is achieved, in addition to increasing the available cycle time of the programmable logic array apparatus to KT, as described above.

FIG. 3a also illustrates the employment of a register to eliminate the need for address bits in either the AND plane 12 or the OR plane (not shown in FIG. 3a). For example, in FIG. 3a, referring to minterm line $C_1$ in block 154, a precharge switching transistor 162 is connected to minterm line $C_1$ at the input to minterm buffer 168. Preferably, the precharge switching transistors, represented by precharge switching transistor 162, are p-channel field effect transistors. The precharge switching transistor 162 is enabled by a precharge signal applied at input $P_1$. It should be noted that the circuitry in FIG. 3a is simplified in that each of the respective minterm lines $C_1$, $C_2$, ... will have connected at its respective buffer input a similar precharging switching transistor actuated by a precharge signal. In the preferred embodiment of the present invention, each block has a separate precharging signal $P_1$, $P_2$, ... to enable the precharge swirching transistors for all minterm lines within a respective block.

The minterm lines, such as minterm line $C_1$ are discharged at the left side of FIG. 3a. In the case where the address sequence of the various instructions of the program to be implemented by the programmable logic array is predictable, the fixed nature of the address sequence makes it feasible to move the address generation function from the programmable logic array AND plane 12 to an external sequential machine which eliminates the need to feed back address information from the OR plane (not shown in FIG. 3a) to the AND plane 12 in order to establish the next sequential instruction to be executed. If the instruction flow is established such that each address is obtained from the previous address by means of a simple increment, the sequential machine may be a simple counter. Thus a simple counter with a decoder would eliminate the need for the sub-address and address fields from AND plane 12 as well as eliminate the need for feedback of the sub-address, load sub-address, and address fields from the OR plane to the AND plane.

One skilled in the art will recognize that the function of a combination of a counter and a decoder that selects only one count at a time may be performed by a shift register in which one bit is set and the rest are cleared. Such a shift register 166 is contemplated to be employed in the preferred embodiment of the present invention.

There are desirable features in employing a shift register for address implementation in a programmable logic array apparatus such as the present invention: a possible reduction in area occupied by the apparatus in an integrated circuit since a shift register is a regular component efficiently implemented in an integrated circuit, and a major reduction in power since the shift register consumes little power because only two bits change at any one time.

Design flexibility is also an advantage of employing a shift register for address information control. The decision regarding how many address bits to control by the shift register, as opposed to continuing to provide external address information to the AND plane may typically be driven by real estate considerations, since for each address input that is kept in the AND plane 12, the size of the required shift register is halved.

When the programmable logic array is partitioned so that each block contains 1/K of the total number of addresses N, the size of the shift register decreases by 1/K. For example, when K=8 and N=1024, the shift register must be only 128 bits long. Further, a single shift register can serve all blocks, so no duplication is required. This multiple block service is accomplished by driving K/2 blocks with the outputs of the master cells of the register (designated M in register 166 in FIG. 3a) with the second half of the blocks being driven by the slave cells (designated S in register 166 of FIG. 3a).

If the microcode, or program instructions, are listed sequentially, there may be groups of instructions that execute unconditionally and do not repeat during the duration of the frame; groups of instructions that execute unconditionally but are repeated two, four, eight times during a frame, or the like; and instructions that execute on condition, which may form a part of either of the two types of instructions previously mentioned. The groups of instructions that repeat are subroutines, and all possible instructions corresponding to the same address may be termed branches. Branches of an instruction must form a complete and orthogonal set, i.e., one of them must execute, but only one of them can execute.

Partitioning a programmable logic array apparatus as illustrated in FIG. 3a corresponds to a grouping of instructions according to the k least significant bits of the respective instruction addresses, where $K = 2^k$. For example, if K=8, then k=3, and block 1 will contain all instructions whose least significant bits are 000, block 2 will contain all instructions whose least significant bits are 001, and so on. Block 8 will contain all instructions whose least significant bits are 111. All branches of an instruction will in such manner have the same address, so all will be in the same block. Each instruction or branch corresponds to a minterm line in the corresponding programmable logic array.

For sub-routines, when a group of instructions repeats two times in a frame, the most significant bit will be 0 the first time, and 1 the second time. If the group repeats four times, the two most significant bits will differ, and so on. However, the least significant bits of those instructions' addresses will be the same. Thus, all repeated instructions are assigned to the same block. They may be stored there only once, in which case they must be accessed repeatedly, or they may be stored repeatedly and each instance of the instruction accessed only once. The former approach results in reduced programmable logic array real estate required but requires the addressing circuitry to take care of repeated access. The latter approach requires more programmable logic array real estate, but simplifies the addressing circuitry. The preferred embodiment of the present invention, shown in FIG. 3a, employs the first approach: storing repeat instructions only once and accessing those stored instructions repeatedly.

Branches are provided for by arranging for the shift register bit corresponding to their address to drive the evaluation transistors of all the branches. The control bits insure that only one of the instructions is discharged at a time. This is the function of bit C in FIG. 3a.

The handling of repeated instructions depends upon how they are stored in the programmable logic array apparatus blocks. If the repeated instructions are mapped into multiple minterm lines, a one-to-one correspondence between shift register bits and minterm lines (or groups of lines, if there are branches) is established. If these instructions are stored only once in the programmable logic array apparatus, then the minterm line corresponding to the repeated instruction must be selected by two or more different shift register bits. Such a repeat selection is effected using OR gates.

The total number of minterm lines may differ from the total number of addresses N in the event that branches increase the number of minterm lines corresponding to an address, or in the event that repeated blocks decrease the number of minterm lines when the instructions are stored only once, as in the preferred embodiment.

FIG. 3b is a table representing a short program, the sequencing of which is performed by the structure in FIG. 3a.

In FIG. 3b, two sequences of execution of program instructions are illustrated. Mode 1 is the sequence of instructions $C_1, C_2, \ldots,$ etc. which is executed when bit C (of FIG. 3a) is set at C=0. In Mode 1, instructions $C_1$–$C_{13}$ are executed, then instructions $C_6$–$C_8$ are repeated. This situation illustrates a subroutine operation, such as a do-loop operation, or similar operations familiar to those skilled in the art.

Setting bit C=1 causes the structure of FIG. 3a to execute the program steps of FIG. 3b according to Mode 2. In Mode 2, the sequence of execution of program instructions $C_1$–$C_{17}$ is different than in Mode 1. Further, in Mode 2, program instructions $C_{14}$ and $C_{15}$ are repeated.

The execution of an instruction $C_1$–$C_{17}$ is effected by enablement of a minterm line $C_1$–$C_{17}$ in the structure of FIG. 3a. Thus execution of instruction $C_1$ in FIG. 3b is effected by the presence of a "0" bit in cell $M_1$ of register 166 in FIG. 3a.

The control bit C in FIG. 3a does not affect minterm lines $C_1, C_5, C_9,$ and $C_{13}$ in block 154. Thus, in FIG. 3b, instructions $C_1, C_5,$ and $C_9,$ and $C_{13}$ are executed at the same sequential point in both Mode 1 and Mode 2. This illustrates the handling of program instructions having no associated branch operation.

Thus, returning to FIG. 3a, for purposes of illustration, presume a program having 16 program steps identified by a 4-bit address: $A_3, A_2, A_1, A_0$. The least significant bits $A_0, A_1$ of the address of a given instruction are eliminated by the partitioning of the AND plane 12 into 4 blocks 154, 156, 158, and 160. Address bits $A_2$ and $A_3$ are handled by the shift register 166. The charging of the minterm lines $C_1$ through $C_{17}$ adjacent the respective minterm line buffers (representatively labelled 168 in block 154) is preferred because such an arrangement precludes the necessity of charging the rest of the minterm line to the left of the buffer, provided the inputs are prevented from changing at arbitrary times. As discussed earlier in connection with FIG. 2a, such control of when inputs may change is effected in the preferred embodiment of the present invention by the use of an IN signal. Further, such precharging adjacent the input of the buffer 168 eliminates partial discharge during evaluation.

The handling of two address bits by the shift register 166 in FIG. 3a requires that the shift register 166 comprise four cells, master and slave ($M_1S_1, M_2S_2, M_3S_3, M_4S_4$). The use of AND gates 170, 172, 174, and 176 effects the selection of repeated minterm lines to effect branching and subroutines, as discussed above. For example, in FIG. 3a, minterm line $C_6$ is subject to repeat selection through AND gate 170, minterm lines $C_7$ and $C_8$ are subject to repeat selection through AND gate 172, and minterm lines $C_{14}$ and $C_{15}$ are subject to repeat selection through AND gates 172, 174, and 176. The embodiment illustrated in FIG. 3a contemplates two state operation, as indicated by the common line C contained in each of blocks 156, 158, and 160.

As may be observed by inspection of FIG. 3a, connection between the shift register 166 and the AND plane 12 served thereby requires routing of a number of connection lines equal to two times the number of shift register bits. If real estate is at a premium and it is more efficient to do so, one may retain one or more address bits within the AND plane structure of the programmable logic array apparatus, providing for external generation of address information. Inclusion of an address bit within the AND plane structure of the programmable logic array apparatus halves the size of the shift register, and allows reduction of the number of connecting lines necessary between the shift register effecting address control and the remainder of the programmable logic array apparatus. Any increase in real estate caused by address generation circuitry is generally compensated by the decrease in shift register size.

Other design characteristics may be accommodated in the flexibility provided by the preferred embodiment of the present invention. If it is desired to minimize the space required to provide connection lines between a shift register and the OR plane-AND plane structure of the programmable logic array apparatus, it may be possible to use separate shift registers, such as a first shift register to serve K/2 blocks and the second shift register to serve the remaining K/2 blocks of the programmable logic array apparatus. In such manner, the number of lines to be routed is decreased by a factor of ½.

For example, in an embodiment of a programmable logic array apparatus involving 384 addresses (N=384), 320 minterm lines (M=320), and 8 blocks (K=8), then 48 addresses per block (384/8) are required. If one address bit is kept in the AND plane, then a 24-bit shift register is required, with each bit serving two addresses, and 48 lines must be routed from the shift register to the AND plane. Alternatively, two 24-bit shift registers may be used, in which case only 24 lines must be routed.

In FIG. 3a, the cells $M_1S_1$-$M_4S_4$ of shift register 166 are connected in a predetermined way to minterm lines $C_1$-$C_{17}$ among the various blocks 154, 156, 158, 160. The connection among the various minterm lines $C_1$-$C_{17}$ is established by the program to be implemented by the programmable logic array apparatus in which the AND plane 12 of FIG. 3a is to be employed. Sequencing of the program steps, or instructions, of the program is done cycling one bit through the shift register 166. Specifically, the cells $M_1S_1$-$M_4S_4$ of the shift register 166 are connected to the drains of evaluation switching transistors (representatively identified by evaluation switching transistor 169) within the minterm lines $C_1$-$C_{17}$. Preferably, the evaluation switching transistors, represented by evaluation switching transistor 169, are n-channel field effect transistors. Accordingly, when a cell of shift register 166 contains a 0, a low potential is present at the respective drain to which that cell is connected. When evaluation switching transistor 169 is gated by an evaluation signal, such as EV1 in block 154, minterm line $C_1$ is connected to a low potential (effectively to ground) to effect discharging of minterm line $C_1$. Evaluation signals EV2 to EV4 are then turned on in sequence, enabling minterm lines $C_2$, $C_3$, $C_4$. After this, the shift register 166 is clocked and the sequence is repeated. As one skilled in the art can see, cycling a "0" bit appropriately through the shift register 166 enables (i.e., presents a low potential to) selected minterm lines $C_1$-$C_{17}$ in a predetermined order, which order is established by the location of the minterm lines $C_1$-$C_{17}$ in the blocks 154, 156, 158 and 160.

FIG. 4 is an electrical schematic diagram of a second interim embodiment of the present invention illustrating additional features incorporated in the preferred embodiment, to be discussed in detail hereinafter. In FIG. 4, a control register 22 provides control signals via line(s) 20 through control bit buffer 16 to control bit line 44 and through control bit inverting buffer 18 to control bit line 46. Further, one address bit is maintained in the AND plane 12 and provided as an external address at address input 178 through address input buffer 28 to address bit line 52 and through address bit inverting buffer 30 to address bit line 54.

A control signal block 180 controls the application of clocking signals to the programmable logic array apparatus illustrated in FIG. 4 so that an IN signal is applied via line 140 to control transmission gates 142, 144, 150, and 152 in a manner whereby when the IN signal is positive, the polarities present at the respective control transmission gates 142, 144, 150, and 152 are as indicated in FIG. 4 and those control transmission gates are enabled so that the control bit information may be passed to control bit lines 42, 46 and address bit lines 52, 54.

Minterm lines 36, 38 are common to both AND plane 12 and OR plane 14 with buffer 62 situated in minterm line 36 intermediate AND plane 12 and OR plane 14 and buffer 64 situated in minterm line 38 intermediate AND plane 12 and OR plane 14. Precharging of minterm lines 36, 38 is effected, respectively, through MPA switching transistors 68 and 70. Switching transistors 68 and 70 are enabled by precharge AND signal PA which is emitted in a preselected time period by control signal block 180 on PA line 182. Shift register 166 is connected to the drains of MDA switching transistors 40a and 42a and, as previously described, address bits are cycled through shift register 166 in a predetermined sequence in order to apply a low potential to the drains of MDA switching transistors 40a and 42a, thereby enabling MDA switching transistors 40a and 42a to, in predetermined time sequence, discharge minterm lines 36 and 38 in response to evaluate signal EV, which is provided by control signal block 180 on EV line 184.

In FIG. 4, the OR plane is precharged by a separate precharge signal PO emitted by control signal block 180 on PO line 186 to gate MPO switching transistors 116 and 116a. Preferably, MPO switching transistors 116, 116a are n-channel field effect transistors. The precharge signal PO is provided by control signal block 180 at a time delayed somewhat after the precharge signal PA in order to insure that the AND plane 12 is fully charged and settled prior to precharging the OR plane 14. This function was previously performed by a delayed clock circuit as earlier described in connection with FIG. 1a and FIG. 2a.

FIG. 4 illustrates an OR plane 14 having two resultant bit output lines 82 and 82a. The inverting buffer-/output transmission gate arrangement provided in the prior art embodiment of FIG. 1a and the interim embodiment of FIG. 2a are replaced in this further interim embodiment of FIG. 4 by output switching transistors 188 and 190 (preferably n-channel field effect transistors) which are gated by a select block signal SB provided by control signal block 180 via SB line 192. The provision of separate precharge signals PO, PA and evaluation signal EV allows elimination of the companion virtual ground lines previously required for the prior art embodiment of FIG. 1a and the interim embodiment of FIG. 2a.

Further, the select block signal SB, as mentioned above, also allows for elimination of output transmission gates previously required in association with the OR plane 14.

A sub-address latch is no longer required since no feedback is provided regarding address information from the OR plane 14 to the AND plane 12 in the embodiment illustrated in FIG. 4.

In FIG. 5, an electrical schematic diagram of two blocks of the preferred embodiment of the present invention is illustrated. In FIG. 5 a control register 22 provides control bit signals via line(s) 20 to blocks 200 and 202.

Specifically, control signals are applied to control bit buffer 16 and control bit inverting buffer 18, controlled by signal IN1 from control signal block 180a through control transmission gates 142a, 144a to control bit lines 44a, 46a. The outputs of buffer 16 and inverting buffer 18 are also applied to control transmission gates 142b, 144b respectively which are controlled by signal IN2 from control signal block 180b and connected to control bit lines 44b, 46b.

Shift register 166a controls enablement of minterm lines 36a, 38a and shift register 166b controls enablement of minterm lines 36b, 38b. Of course, shift registers 166a and 166b can be incorporated into a single shift register. Control of the respective minterm lines 36a, 38a is effected by shift register 166a through MDA switching transistors 40a, 42a, and control of enablement of minterm lines 36b, 38b is effected by shift register 166b through MDA switching transistors 40b, 42b.

External address information is applied to the AND planes 12a and 12b via address input line 178 through address bit buffer 28 and address bit inverting buffer 30 via control transmission gates 150a, 152a which control application of external address bit information in response to signal IN1 to address bit lines 52a, 54a. The outputs of buffer 28 and inverting buffer 30 are also applied through control transmission gates 150b, 152b respectively which, in response to signal IN2, control application of address bit information to address bit lines 52b, 54b.

Minterm lines 36a, 38a are precharged adjacent their respective buffers 62a, 64a in response to precharge signal PO1 provided by control signal block 180a to MPA switching transistors 68a, 70a; OR plane 14a is precharged in response to precharge signal PO1 applied to gate MPO switching transistors 116a, 117a; and output switching transistors 188a, 190a are responsive to select block signal SB1 provided by control signal block 180a to pass resultant output signals from resultant output lines 82a, 83a. As a result, resultant output line 82a is connected to common line N and resultant output line 83a is connected to common line N+1.

The precharging of OR plane 14b and the output of signals from OR plane 14b occurs in the same manner as previously described in connection with OR plane 14a except that such precharging and signal output occurs in response to control signals and clocking signals generated by control signal block 180b. Rather than repeat the explanation, in the interest of clarity of description, suffice it to say that similar elements of OR plane 14b corresponding to elements of OR plane 14a are identified with similar reference numerals with an appended "b" to indicate their association with OR plane 14b.

FIG. 5 also illustrates details of the output circuit of the preferred embodiment of the present invention. The output circuit must combine the outputs of the K individual blocks operating at a rate of f/K into a single stream switching at the rate f, as previously described. Focusing, for the purposes of illustration, on block 200 of the programmable logic array apparatus of FIG. 5, the OR plane 14a includes resultant output lines 82a, 83a. Associated with each of the resultant output lines 82a, 83a, is a discharge transistor so that resultant output line 82a has associated therewith discharge transistor 81a and resultant output line 83a has associated therewith discharge transistor 91a. Preferably, each of the discharge transistors 81a, 91a is an n-type device. Each of the resultant output lines 82a, 83a corresponds to a bit in an instruction word. If the bit is intended to represent a "1" in an instruction word, the corresponding resultant output line is connected to the drain of a discharge transistor whose source is tied to ground and whose gate is driven by the output of a minterm buffer. Thus, for example in FIG. 5, resultant output line 82a is intended to represent a "1" in an instruction word when minterm line 38a is selected so that the drain of discharge transistor 81a is connected to resultant output line 82a, the source of discharge transistor 81a is connected to ground, and the gate of discharge transistor 81a is connected to minterm line 38a and is driven by the output of buffer 64a. If the resultant output line is to represent a "0" in a bit of an instruction word upon selection of a given minterm line, then no connection between that resultant output line and a discharge transistor is effected, so that, for example in FIG. 5, resultant output line 82a is not connected to a discharge transistor at the intersection of resultant output line 82a and minterm line 36a.

All corresponding resultant output lines of the various K blocks are connected to the source of a pass transistor 204, 206. The drains of all pass transistors 204, 206 are connected, respectively, to output buffer latch assemblies 216, 218.

Common output lines 208, 210 connect all corresponding outputs of the K blocks.

Thus, in FIG. 5, pass transistor 204 has its source connected to common line 208 and pass transistor 206 has its source connected to common line 210. The pass transistors are activated by a PASS signal applied to the gates of the pass transistors 204, 206. The common lines 208 and 210 are precharged through precharge transistors 212 and 214, which are gated by a signal PCH.

In order to fully understand the operation of the output circuit illustrated in FIG. 5, it is necessary to refer to the timing diagram illustrated in FIG. 6. In FIG. 6, the various signals associated with one block of the circuit illustrated in FIG. 5 are displayed.

In FIG. 6, clock cycles PHI1, PHI2, and PHI3 comprise a 3-phase clock signal. The signal IN is illustrated for a single block and, as previously described, enables changes of signal levels on control bit lines 44, 46 and address bit lines 52, 54. The signal IN is active in its high state. The precharge signal PA, which is employed to precharge the AND plane 12, is active in its low state and is activated during the active period of the signal IN. The signal PA remains active after the termination of the active period of the signal IN, thus ensuring precharge of the AND plane 12 after all changes of state are completed on the control bit lines 44, 46 and the address bit lines 52, 54.

The signal PO is active in its high state and is employed to precharge the OR plane 14. The signal PO is activated after the activation of signal PA and terminates its active period substantially at the same time as the termination of the active period of the signal PA.

The evaluation signal EV is active in its high state and is activated after the termination of the signals PA and PO. The activation of the signal EV, in cooperation with the array of address bits within the shift register 166, selectively enables minterm lines 36, 38. In FIG. 6, buffer 62, 64 inputs and outputs are illustrated for both the situation where the minterm line affecting the buffer 62, 64 is selected (indicated by "S"), as well as the signal pattern for buffers 62, 64 which are affected by non-selection of an associated minterm line (indicated by "NS"). Thus, in FIG. 6, it may be seen that the input of the buffer 62, 64, on the occasion of activation of the signal PA, is raised to a high level. Also indicated in FIG. 6, is the fact that if the input of the buffer 62, 64 is already at a high level the activation of signal PA has no effect on that input and the signal level remains high. Further, upon activation of the signal EV, the buffer 62, 64 input is not affected if the minterm line associated with that buffer is not selected. However, if a minterm line is selected, there is an RC discharge of that selected minterm line which draws the buffer 62, 64 input to a low level, indicated by the line designated "S" associated with the buffer 62, 64 input signal representation.

Since the buffers 62, 64 are inverting buffers, the output signal of buffer 62, 64 is substantially a mirror image of the input signal for each respective buffer. Thus, on activation of the signal PA, the output of buffer 62, 64 decays from a high level to a low level or, if the output had been at a low level, it remains at a low level. At a predetermined point along the RC discharge curve of the input of the buffer 62, 64 when the minterm line associated with a particular buffer 62, 64 is selected, the output of the buffer 62, 64 shifts to a high level, as indicated by the curve designated "S" in FIG. 6 for the buffer 62, 64 output signal indication. If, however, the minterm associated with a particular buffer 62, 64 is not selected, then the buffer output remains at a low level as indicated by the line designated "NS" for the signal curve associated with buffer 62, 64 output.

For purposes of illustration, the signals in FIG. 6 reflect the case where the particular program instruction being executed by the particular block for which the signals are illustrated results in resultant output line 82 being discharged by the select block signal SB and resultant output line 83 not being discharged by the select block signal SB. Accordingly, upon the activation of the signal PO, both resultant output lines 82 and 83 are raised to a high state during precharge of the OR plane 14. Of course, as indicated in FIG. 6, if resultant output line 82, 83 is high then the signal is unchanged and remains high. Since, in FIG. 6, the resultant output line 82 is programmed to be selected (i.e., there is a discharge transistor 81, gated by the buffer 64 output, connecting the resultant output line 82 with ground) then, when the buffer 64 output goes high, the resultant output line 82 is discharged to a low state. In FIG. 6, the resultant output line 83 does not have a discharge transistor at the juncture of minterm line 38 (presumed selected in FIG. 6) and, consequently, no discharge of resultant output line 83 occurs. Thus resultant output line 83 remains at a high state.

Select block signals SB sequentially select individual blocks of the K blocks in the programmable logic array apparatus of the preferred embodiment of the present invention. The select block signals SB preferably occur one clock cycle apart.

In the lower portion of FIG. 6, the PCH signal, used to charge the common lines 208, 210 to VCC is illustrated and, preferably, is the second phase of the clock signal, signal PHI2. The PASS signal which is employed to gate the PASS transistors 204, 206 is also illustrated and, preferably, is the first phase of the clock signal, signal PHI1.

The select block signal SB for the current block is shown in solid line in FIG. 6; the previous block and next block signals SB are shown in phantom in FIG. 6. The select block signal SB for a block (solid line) occurs while the evaluation signal EV is in its active state (high) and output line 82 has been discharged to a low state in response to the high output of buffer 64. Select block signal SB gates the output switching transistors 188, 190, thereby connecting the resultant output lines 82, 83 to common output lines 208, 210, respectively. Since resultant output line 82 is grounded through output switching transistor 188 and discharge transistor 81 in response to the gating provided by the high signal at the output of buffer 64, the common line 208 is discharged, as indicated in FIG. 6.

Upon deactivation of the select block signal SB, the output switching transistors 188, 190 are disabled and rendered non-conductive, the PCH signal goes positive and recharges common line 208 to a high state.

As a result of the discharge of common line 208, the input to the output buffer latch assembly 216 may or may not be affected. If the input to the output buffer latch assembly 216 was high when common line 208 was discharged, then the PASS signal (which occurs during the duration of the active state of the signal SB) gates the PASS transistors 204, 206 and the input to the output buffer latch assembly 216 is discharged through common line 208, output switching transistor 188, and discharge transistor 81. If, however, the input to the output buffer latch assembly 216 was low, then the gating of the PASS transistor 204 would have no effect and provide no occasion for change of the signal level at the input of the output buffer latch assembly 216.

In the example illustrated in FIG. 6, recall that the output line 83 was not grounded at minterm line 38 through a discharge transistor and, therefore, the block select signal SB, in gating the output switching transistor 190, presents a high potential to common line 210, which already has a high potential as a result of the precharging thereof by previously occurring signal PCH. Thus, common line 210 is not discharged. The subsequent PASS signal gates PASS transistor 206, presenting a high potential to the input of output buffer latch assembly 218. If the input at output buffer latch assembly 218 was already at a high state, no change occurs. However, if the input to the output buffer latch assembly 218 was low, the high potential presented by gating the PASS transistor 206 raises the potential of the input of the output buffer latch assembly 218 to high.

Thus, all output switching transistors 188, 190 of FIG. 5 are activated by block select signals SB1, SB2, ..., SBK, which are separated by an interval during which the common lines 208, 210 are precharged by the application of the PCH signal to precharge transistors 212, 214 to apply the reference voltage VCC to the common output lines 208, 210. K of the select block signals SB1, SB2, ..., SBK are turned on in an interval K·T, so the output line is driven at a rate of $f = 1/T$. The block select signal for a particular block becomes active at the end of an evaluation cycle corresponding to that block, and occurs at a rate f/K. Each common output line is then connected to an output buffer latch assembly 216, 218 through a PASS transistor 204, 206 which is gated during the period of the block select signal.

If the bit in the instruction word stored in a given resultant output line is a "0", then that resultant output line is not discharged (i.e., it is not connected to the source of a discharge transistor 81a, 91a) and, therefore, the next subsequent precharge cycle will not require application of any power to that resultant output line. Further, in the case of a resultant output line storing a "0", when the select block signal corresponding to that block is present, actuating an output switching transistor 188, 190, the common line 208, 210 will not be discharged either so that the next precharge cycle will not consume power at all.

If, however, the stored bit of a resultant output line 82a, 83a is a "1", then the resultant output line 82a, 83a will be discharged during evaluation of that resultant output line and when the block select signal enables the output switching transistor 188, 190 associated with that resultant output line 82a, 83a, the common output line 208, 210 will be discharged as well. Thus, only in the case where the stored bit is a "1" in a resultant output line 82a, 83a will the precharge cycle consume any power to recharge a previously discharged resultant output line 82a, 83a and its associated common output line 208, 210. For this reason, if most bits in the instruction words are "0", the previously described convention of assigning a discharge transistor to a "1" is advantageous. If "1" states were the majority, however, transistors would preferably be assigned to "0" instead.

When a PASS signal turns on a PASS transistor 204, 206, the input node of the respective output buffer latch assembly 216, 218 does not change state as a matter of course. That is, if the input node of the output buffer latch assembly 216, 218 was previously discharged as a result of an earlier evaluation, the buffer will not change state if the output line connected to that input node by enablement of the PASS transistor 204, 206 connects a discharged common output line 208, 210. Similarly, if the common output line 208, 210 remained charged and the input node to the output buffer latch assembly 216, 218 was high from a previous cycle, no change in state of the input node of the output buffer latch assembly 216, 218 would occur.

The preferred embodiment illustrated in FIG. 5 provides, therefore, that false transitions in the common output line, 208, 210 when going from a "0" to a "0" (i.e., from a discharged state to a discharged state from cycle to cycle) do not take place in the output buffer latch assemblies 216, 218 and, consequently, no power is dissipated. Only when there is a change of state (i.e., from a "0" to a "1", or from a "1" to a "0") from cycle to cycle is the input node of the output buffer latch assembly 216, 218 discharged through the PASS transistor 204, 206, through the output switching transistor 188, 190 through the appropriate discharge transistor 81a, 91a for a "1-to-0" transition. For a "0-to-1" transition, gating the PASS transistors 204, 206 applies the +1 charge stored in the common output line 208, 210 to the input node of the output buffer latch assembly 216, 218 to force the change of state from "1" to "0".

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims.

I claim:

1. An apparatus adaptable for use as a programmable logic array for receiving multi-bit control signals from a signal source and producing resultant output signals logically related to said control signals according to a program, the apparatus comprising:
    a clock means for generating a clock signal;
    an input means for receiving said control signal and producing input signals representative of said control signals;
    a first iteration processing means for effecting a first iteration operation, upon said input signals and producing first iteration output signals;
    a second iteration processing means for effecting a second iteration operation upon said first iteration output signals and producing said resultant output signals; and
    a plurality of electrically conductive common lines common to said first iteration processing means and said second iteration processing means;
    said input means comprising a plurality of input cells, at least some of said plurality of input cells receiving respective bits of said control signals;
    said first iteration processing means including a plurality of first signal lines cooperating with said plurality of common lines to define an array of first crosspoints;
    said second iteration processing means including a plurality of second signal lines cooperating with said plurality of common lines to define an array of second crosspoints;
    said plurality of input cells being operatively connected to said plurality of first signal lines, and said resultant output signals being presented by said plurality of second signal lines;
    said first iteration processing means and said second iteration processing means each having first switching means responsive to said clock signal for selectively connecting a voltage source to effect precharging of said plurality of second signal lines and said plurality of common lines;
    said plurality of common lines being operatively connected to a second switching means responsive to said clock signal for connecting said plurality of common lines to ground;
    said first iteration processing means further including a plurality of third switching means for affecting continuity of at least a portion of selected of said plurality of common lines, said plurality of third switching means being serially connected in selected of said plurality of common lines and being gated by selected ones of said plurality of first signal lines according to said program, whereby said gating of appropriate of said plurality of third switching means connects predetermined portions of said plurality of common lines to ground.

2. An apparatus adaptable for use as a programmable logic array as recited in claim 1 wherein each of said plurality of input cells comprises a buffer-pair, one of said buffer-pair being an inverting buffer, each buffer of each said buffer-pair being operatively connected to at least one of said plurality of first signal lines.

3. An apparatus adaptable for use as a programmable logic array as recited in claim 1 3 wherein an intermediate inverting buffer is connected in each of said plurality of common lines intermediate said first iteration processing means and said second iteration processing means.

4. An apparatus adaptable for use as a programmable logic array as recited in claim 3 wherein said presentation of each of said resultant output signals occurs through an inverting output buffer in each of said plurality of second signal lines.

5. An apparatus adaptable for use as a programmable logic array for receiving multi-bit control signals and producing resultant output signals logically related to said control signals according to a program, the apparatus comprising:
    a clock means for generating a plurality of clock signals;
    an input means for receiving said control signals;
    a first iteration processing means for effecting a first operation; and
    a second iteration processing means for effecting a second operation;
    said input means, said first iteration processing means, said second iteration processing means and said clock means cooperating to execute said program by precharging a plurality of lines and selectively discharging said plurality of lines in response to said control signals;

said selective discharging being effected by a plurality of switching means for affecting the continuity of said plurality of lines;

at least some of said plurality of switching means being gated by said bits of said control signals according to said program;

each of said at least some of said plurality of switching means affecting continuity of a respective one of said plurality of lines and being connected in a manner whereby said continuity of only a specified portion of said respective one of said plurality of lines is affected by each of said at least some of said plurality of switching means;

said program being executed by selectively gating appropriate ones of said plurality of switching means to define a continuous path for said discharge.

6. An improved programmable logic array apparatus, said apparatus having at least one iteration processing means for receiving input signals, and producing resultant output signals logically related to said input signals according to a program, said at least one iteration processing means being precharged in response to a first clock signal and being selectively discharged in response to a second clock signal through a plurality of switch means operatively connected within said at least one iteration processing means according to said program for controlling electrical continuity of selected portions of an array of minterm lines, at least some of said plurality of switch means being responsive to said input signals, the improvement comprising:

series connection of those of said plurality of switch means associated with each respective one of said array of minterm lines in at least a first of said plurality of iteration processing means.

7. An improved programmable logic array apparatus as recited in claim 6 wherein said program comprises a plurality of program steps, each of said plurality of program steps having an associated multi-bit address, the improvement further comprising:

establishing a fixed order for occurrence of said plurality of program steps and storing at least a portion of said bits of said associated addresses in cyclic register means for storing, said array of minterm lines being operatively connected with said register means; and said array of minterm lines being selectively presented an appropriately low potential to effect discharge of said selected minterm line according to arrangement of said address bits within said register means.

8. An improved programmable logic array apparatus as recited in claim 7 wherein said resultant output signals are produced by a last of said plurality of iteration processing means, the improvement further comprising controlling said precharging and application of said input signals to said plurality of switching means by separate clock signals.

9. An improved programmable logic array apparatus as recited in claim 7 wherein a last iteration processing means of said plurality of iteration processing means produces said resultant output signals, said improvement further comprising:

arranging at least said last iteration processing means in a plurality of blocks, each of said blocks having at least one output line, said at least said last iteration processing means including a plurality of common output lines, each of said plurality of common output lines being operatively connected to at least one of said at least one output line, and each of said plurality of common output lines terminating in an output buffer means for holding said resultant output signals.

10. An improved programmable logic array apparatus as recited in claim 9 wherein said last iteration processing means is precharged, selectively discharged, and selection of a particular block of said plurality of blocks for charging a respective output buffer means are each effected in response to a different clock signal.

11. An improved programmable logic array apparatus as recited in claim 6 wherein said resultant output signals are produced by a last of said plurality of iteration processing means, the improvement further comprising controlling said precharging and application of said input signals to said plurality of switching means by separate clock signals.

12. An improved programmable logic array apparatus as recited in claim 8 wherein a last iteration processing means produces said resultant output signals, said improvement further comprising:

arranging at least said last iteration processing means in a plurality of blocks, each of said blocks having at least one output line, said at least said last iteration processing means including a plurality of common output lines, each of said plurality of common output lines being operatively connected to at least one of said at least one output line, and each of said plurality of common output lines terminating in an output buffer means for holding said resultant output signals.

13. An improved programmable logic array apparatus as recited in claim 12 wherein said last iteration processing means is precharged, selectively discharged, and selection of a particular block of said plurality of blocks for charging a respective output buffer means are each effected in response to a different clock signal.

14. An improved programmable logic array apparatus as recited in claim 6 wherein at last iteration processing means of said plurality of iteration processing means produces said resultant output signals, said improvement further comprising:

arranging at least said last iteration processing means in a plurality of blocks, each of said blocks having at least one output line, said at least said last iteration processing means including a plurality of common output lines, each of said plurality of common output lines being operatively connected to at least one of said at least one output line, and each of said plurality of common output lines terminating in an output buffer means for holding said resultant output signals.

15. An improved programmable logic array apparatus as recited in claim 14 wherein said last iteration processing means is precharged, selectively discharged, and selection of a particular block of said plurality of blocks for charging a respective output buffer means are each effected in response to a different clock signal.

16. An improved programmable logic array apparatus as recited in claim 6 wherein said resultant output signals are produced by a last of said plurality of iteration processing means and said last of said plurality of iteration processing means is precharged, selectively discharged, and selection of a particular block of said plurality of blocks for charging a respective output buffer means are each effected in response to a different clock signal.

17. An apparatus adaptable for use as a programmable logic array for receiving control signals from a signal source and producing resultant output signals logically related to said control signals according to a program, said program comprising a plurality of program instructions, each of said plurality of program instructions being identified by an address, the apparatus comprising:
- a clock means for generating a plurality of clock signals;
- an input means for receiving said control signals and producing input signals on input lines, said input signals being representative of said control signals;
- at least one program execution means for executing selected of said program instructions;
- each of said at least one program execution means comprising a first iteration processing means for effecting a first iteration operation upon said input signals and producing first iteration output signals; and
- a second iteration processing means for effecting a second iteration operation upon said first iteration output signals and producing said resultant output signals at a plurality of output lines; and
- a plurality of minterm lines common to said first iteration processing means and said second iteration processing means, each of said minterm lines including a buffer means for storing a first charge, the outputs of said buffer means presenting said first iteration output signals to said second iteration processing means;
- selected ones of said plurality of minterm lines having one or more gated switch means for affecting line continuity, gates of said one or more gated switch means being selectively connected to said input lines, placement of said gated switch means and said input line connection to selected of said gated switch means being defined by said first iteration operation;
- selection of said minterm lines for participation in a respective program instruction being determined in response to selected of said plurality of clock signals according to said address, said address being stored in a memory means for storing address information.

18. An apparatus adaptable for use as a programmable logic array for receiving input signals and producing resultant output signals according to a program, said program comprising a plurality of program instructions, each of said plurality of program instructions being identified by an address, the apparatus comprising:
- a clock means for generating a plurality of clock signals;
- a first iteration processing means for effecting a first iteration operation upon said input signals and producing interim output signals on a plurality of minterm lines; and
- a second iteration processing means for effecting a second iteration operation upon said interim output signals and producing said resultant output signals on a plurality of resultant output lines;
- said first iteration processing means including a plurality of first switching means, said plurality of first switching means being connected in series within selected of said plurality of minterm lines and gated by said input signals according to said program;

selection of which of said plurality of minterm lines is involved in executing said program being effected by cyclic memory means for storing said addresses.

19. An apparatus adaptable for use as programmable logic array as recited in claim 18 wherein operation of the apparatus involves timed gating of a plurality of groups of switching means for effecting precharging and discharging of specified portions of the apparatus, said timed gating of each of said specified portions being effected by a separate one of said plurality of clock signals.

20. An apparatus adaptable for use as programmable logic array as recited in claim 19 wherein the apparatus is arranged in a plurality of blocks, each of said plurality of blocks executing preselected of said plurality of program instructions, said timed gating of said specified portions in respective ones of said plurality of blocks being effected in a pipeline manner, whereby each specified portion in successive of said plurality of blocks is gated at a predetermined interval after the corresponding specified portion of the next preceding of said plurality of blocks.

21. An apparatus adaptable for use as a programmable logic array for receiving multi-bit control signals from a signal source and producing resultant output signals logically related to said control signals according to a program, the apparatus comprising:
- a clock means for generating a clock signal;
- an input means for receiving said control signals and producing input signals representative of said control signals;
- a first iteration processing means for effecting a first iteration operation upon said input signals and producing first iteration output signals;
- a second iteration processing means for effecting a second iteration operation upon said first iteration output signals and producing said resultant output signals; and
- a plurality of electrically conductive common lines common to said first iteration processing means and said second iteration processing means;
- said input means comprising a plurality of input cells, at least some of said plurality of input cells receiving respective bits of said control signals;
- said first iteration processing means including a plurality of first signal lines cooperating with said plurality of common lines to define an array of first crosspoints;
- said second iteration processing means including a plurality of second signal lines cooperating with said plurality of common lines to define an array of second crosspoints;
- said plurality of input cells being operatively connected to said plurality of first signal lines, and said resultant output signals being presented by said plurality of second signal lines;
- said first iteration processing means and said second iteration processing means each having first switching means responsive to said clock signal for selectively connecting a voltage source to effect precharging of said plurality of second signal lines and said plurality of common lines;
- said plurality of common lines being operatively connected to a second switching means responsive to said clock signal for connecting said plurality of common lines to ground;
- said first iteration processing means further including a plurality of third switching means for affecting continuity of at least a portion of selected of said plurality of common lines, said plurality of third switching means being serially connected in selected ones of said plurality of common lines and being gated by selected ones of said plurality of first signal lines according to said program, whereby said gating of appropriate of said plurality of third switching means connects predetermined portions of said plurality of common lines to ground;

each of said plurality of input cells comprising a buffer-pair, one of said buffer-pair being an inverting buffer, each buffer of each said buffer-pair being operatively connected to at least one of said plurality of first signal lines.

22. An apparatus adaptable for use as a programmable logic array as recited in claim 21 wherein an intermediate inverting buffer is connected in each of said plurality of common lines intermediate said first iteration processing means and said second iteration processing means.

23. An apparatus adaptable for use as a programmable logic array as recited in claim 22 wherein said presentation of each of said resultant output signals occurs through an inverting output buffer in each of said plurality of second signal lines.

* * * * *